United States Patent [19]

Kubo et al.

[11] Patent Number: 5,355,532
[45] Date of Patent: Oct. 11, 1994

[54] TELEVISION TUNER UNIT HAVING SHIELD HOUSING

[75] Inventors: Kazuhiko Kubo, Osaka; Akira Usui, Takatsuki; Akira Mishima, Gifu, all of Japan

[73] Assignee: Matsushita Electric Industrial Co., Ltd., Osaka, Japan

[21] Appl. No.: 31,056

[22] Filed: Mar. 29, 1993

Related U.S. Application Data

[63] Continuation of Ser. No. 550,495, Jul. 10, 1990, abandoned.

[30] Foreign Application Priority Data

Jul. 14, 1989 [JP] Japan .................................. 1-182907

[51] Int. Cl.⁵ ............................................. H04B 1/10
[52] U.S. Cl. .............................. 455/301; 455/188.2; 455/314; 455/347
[58] Field of Search ............... 455/180.1, 180.2, 188.1, 455/188.2, 189.1, 191.1, 191.3, 300, 301, 314, 317–319, 323, 3.2, 347, 349; 361/814, 816, 818

[56] References Cited

U.S. PATENT DOCUMENTS

| 4,315,333 | 2/1982 | Yamashita et al. | 455/189 |
| 4,569,084 | 2/1986 | Takahama | 455/189 |
| 4,661,998 | 4/1987 | Yamashita et al. | 455/315 |
| 5,014,349 | 5/1991 | Kubo et al. | 455/189.1 X |
| 5,014,350 | 5/1991 | Nezu | 455/258 |

FOREIGN PATENT DOCUMENTS

| 3226980 | 1/1984 | Fed. Rep. of Germany . |
| 58-204627 | 11/1983 | Japan . |
| 01106628 | 4/1989 | Japan . |

Primary Examiner—Reinhard J. Eisenzopf
Assistant Examiner—Chi H. Pham
Attorney, Agent, or Firm—Stevens, Davis, Miller & Mosher

[57] ABSTRACT

The present invention relates to a television tuner capable of receiving television broadcasting, CATV and satellite broadcasting. The television tuner includes a double superheterodyne tuner for receiving television signals, having an up-converter, a down-converter and a coupler for coupling the up-converter and down-converter, and the television tuner also includes a BS second mixer portion and a FM demodulator, for receiving signals from a broadcasting satellite. The double superheterodyne tuner, the BS second mixer portion and the FM demodulator are disposed in a housing, a combination of the up-converter and the BS second mixer portion is desiredly separated from the down-converter, the coupler is disposed in a space between the combination and the down-converter, and the FM demodulator is disposed in the remaining space of the housing.

9 Claims, 5 Drawing Sheets

TELEVISION TUNER UNIT HAVING SHIELD HOUSING

This application is a continuation of application Ser. No. 07/550,495, filed Jul. 10, 1990 (abandoned).

BACKGROUND OF THE INVENTION

1. Field of the Invention

The present invention relates to a television tuner and in particular to a television tuner which is capable of receiving general television broadcasting, CATV, and satellite broadcasting.

2. Description of the Related Art

Recently, an advance in audio and visual technology has been drastic. An increase in the number of broadcasting channels and a further improvement in picture quality have been demanded. A development for providing more compact satellite broadcasting receiving systems and for incorporating the satellite broadcasting receiving system into a television system has become more active.

It is advantageous to adopt a double superheterodyne system for a TV tuner in consideration of multi-channel reception and necessary band pass characteristics for each channel.

A conventional double superheterodyne type television tuner will be described with reference to the drawings.

Referring now to FIG. 1, there is shown the structure of a conventional double superheterodyne type television tuner. In FIG. 1, reference numerals 1 though 3 denote input band pass filters, each having different frequency characteristics; reference numeral 4 denotes a broad band amplifier (RF amplifier); 5 denotes a first mixer; 6 denotes a first local oscillator; 7 denotes a first intermediate frequency (IF) amplifier; 8 a band pass filter (BPF); 9 a second mixer; 10 a second local oscillator; 11 a second IF amplifier and 14 a prescaler.

The operation of the thus formed tuner shown in FIG. 1 will now be described. A high-frequency signal is inputted into the input band pass filters 1, 2, and 3 provided for each band (for example VHF, CATV and UHF) through a terminal A. The signal which has passed through the filters 1, 2 and 3 is amplified by the broad band amplifier 4 and is then inputted to the first mixer 5. The signal is mixed with an oscillation signal from the first local oscillator 6 in the first mixer 5 from which a signal having a difference component therebetween is outputted as a first IF signal. The IF signal is then amplified. Only the first IF signal is selected by the band pass filter 8 and is then inputted to the second mixer 9 in which the inputted signal is mixed with a second oscillation signal from the second local oscillator 10. A signal having a difference component is outputted from the second mixer 9 as a second IF signal. The second IF signal is inputted to a terminal B through the second IF amplifier 11. The first local oscillator 6 is supplied with a local oscillation tuning voltage. The local oscillation signal from the first local oscillator 6 is frequency-divided by the prescaler 14 from which the frequency-divided output is fed to a channel selector circuit (not shown) from a terminal E.

In the afore-mentioned arrangement, any one of the first IF amplifier 7 and the band pass filter 8 may be preceded by the other according to the design.

The first half of the tuner before the band pass filter 8 in FIG. 1 will be referred to as an up-converter meaning a portion which converts the inputted signal frequency into an IF frequency higher than the inputted signal frequency. The latter half of the tuner after the band pass filter 8 in FIG. 1 is referred to as a down-converter meaning a portion which converts the first IF signal frequency into a second IF frequency lower than the first IF frequency.

A conventional example of a satellite broadcasting receiving tuner (referred to as a BS tuner) will be described with reference to FIGS. 2 and 3. FIG. 2 shows a portion of the BS tuner referred to as a BS second mixer portion comprising an input filter 21, a BS first IF amplifier 22, a mixer 23, a local oscillator 24, a BS second IF amplifier 25, and a prescaler 26. FIG. 3 shows an FM demodulator for the BS tuner comprising a BS second IF amplifier 30, a band pass filter 31, another BS second IF amplifier 32, a phase comparator 33, a loop filter 34, a direct current amplifier 35, a base band amplifier 36, and an oscillator 37.

The operation of the thus formed mixer and FM demodulator shown in FIGS. 2 and 3 will be described. In FIG. 2, a signal from a broadcasting satellite (1.0 to 1.3 GHz) is block-converted into the first intermediate frequency (referred to as BSIF) at a pre-stage, and the converted signal is inputted into a terminal C. The band pass filter 21 passes only a BSIF and inputs the BSIF signal to the mixer 23 through the BS first IF amplifier 22. The BSIF signal is mixed at the mixer 23 with an inputted signal from the local oscillator 24. The mixer 23 outputs a difference signal as a BS second IF signal having a frequency of 403 MHz to a terminal D through the BS second IF amplifier 25. A tuning voltage is applied to the local oscillator 24 from a terminal F' and the local oscillation signal is also applied to the prescaler 26 from the local oscillator 24. The applied signal is frequency-divided and applied to a channel selection circuit (not shown) from the terminal E'.

The BS second IF signal which has been inputted to the terminal D is then inputted to a terminal E in FIG. 3 and amplified in the BS second IF amplifier 30 and is passed though the 400 MHz band pass filter 31 and then inputted into an FM demodulator through the BS second IF amplifier 32. The FM demodulator comprises a phase comparator 33, a loop filter 34, a direct current amplifier 35, and an oscillator 37 which form a phase-locked loop (PLL) for PLL detection. The FM demodulated output from the FM demodulator is inputted to the base band amplifier 36 which provides an amplified demodulated signal to a terminal F.

A conventional example of the structure of a double superheterodyne tuner will be described with reference to FIGS. 4A, 4B and 5. FIGS. 4A and 4B show an arrangement of a housing for a double superheterodyne tuner and a satellite broadcasting receiving tuner, respectively. FIG. 4A shows an arrangement of the double superheterodyne tuner shown in FIG. 1 comprising an up-converter 50, an up- and down-converter coupling filter 51, a down-converter 52 and an antenna input terminal for VHF and UHF signals. FIG. 4B shows an arrangement of a satellite broadcasting receiving tuner shown in FIG. 2 comprising a BS second mixer portion 54, an FM demodulator 55 and a BSIF input terminal 56.

FIG. 5 shows the up- and down-converter coupling filter (up- and down-converter coupler) 51 forming a low pass filter comprising feed-through type capacitors 61 and 62 disposed on the up- and down-converter sides, respectively and a air-cored coil 63. On the both sides of the up- and down-converter coupling filter 51, there are disposed circuit boards 64 and 65 with respective shield plates 66 and 67 for the up- and down-converters. The air-cored coil 63 is disposed in a space between the shield plates 66 and 67. The opposite ends of the air-cooled coil 63 are soldered to the leads of the feed-through type capacitors 61 and 62 secured to the shield plates 66 and 67, respectively to form the filter. The purpose of the shield plates and the low pass filter is to prevent spurious signals from being generated at the down-converter output due to an interference between the local oscillation signals in the up- and down-converters.

In order to provide a tuner which is capable of receiving both a general television signal and a satellite broadcast signal, it is necessary to provide separate housings as shown in FIGS. 4A and 4B and to provide a space for a filter like the filter 51 in the television tuner as shown in FIG. 4A to prevent spurious radiation from being generated. A configuration like this makes it difficult to utilize the space effectively since circuit boards for up- and down-converters have to be separated from each other, and besides, it necessitates lengthy manufacturing steps.

SUMMARY OF THE INVENTION

The present invention is directed to overcoming the aforementioned problems.

It is an object of the present invention to provide a more compact tuner in which tuner portions are disposed in an improved manner.

In order to accomplish this purpose, the present invention provides a television tuner in which a double superheterodyne tuner portion and a BS tuner for demodulating a satellite broadcast signal are housed in a housing for making it possible to provide a compact tuner by designing an optimal arrangement.

Such an arrangement can realize a more compact and integral tuner which is capable of receiving UHF, VHF and satellite broadcasting signals without lowering the interference characteristics of the up- and down-converter tuner.

BRIEF DESCRIPTION THE DRAWINGS

DESCRIPTION OF THE PREFERRED EMBODIMENT

Figure 1:
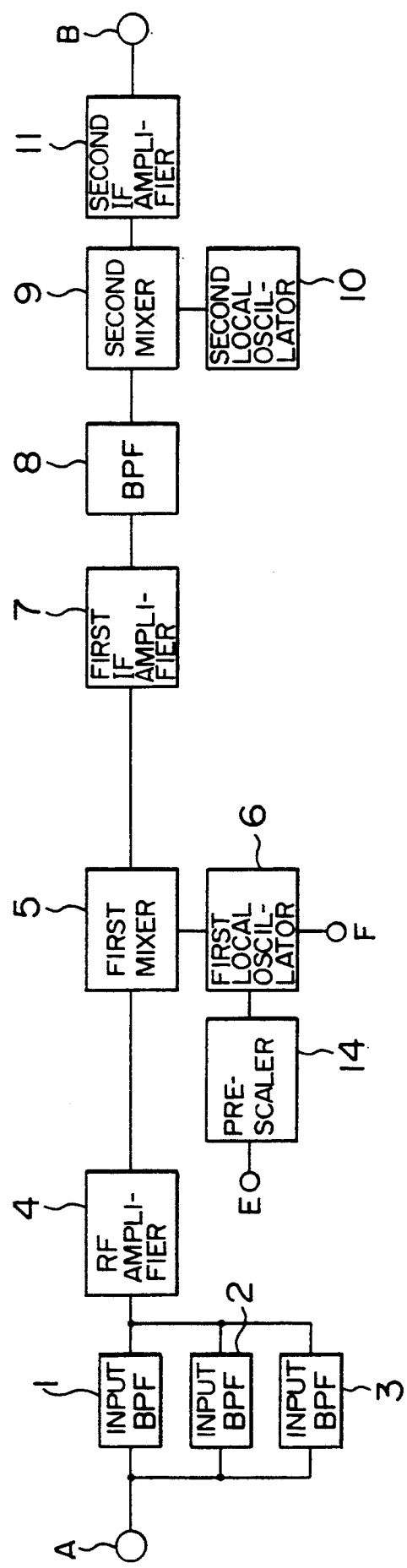
FIG. 1 is a block diagram showing an up- and down-converter tuner.
Figure 2:
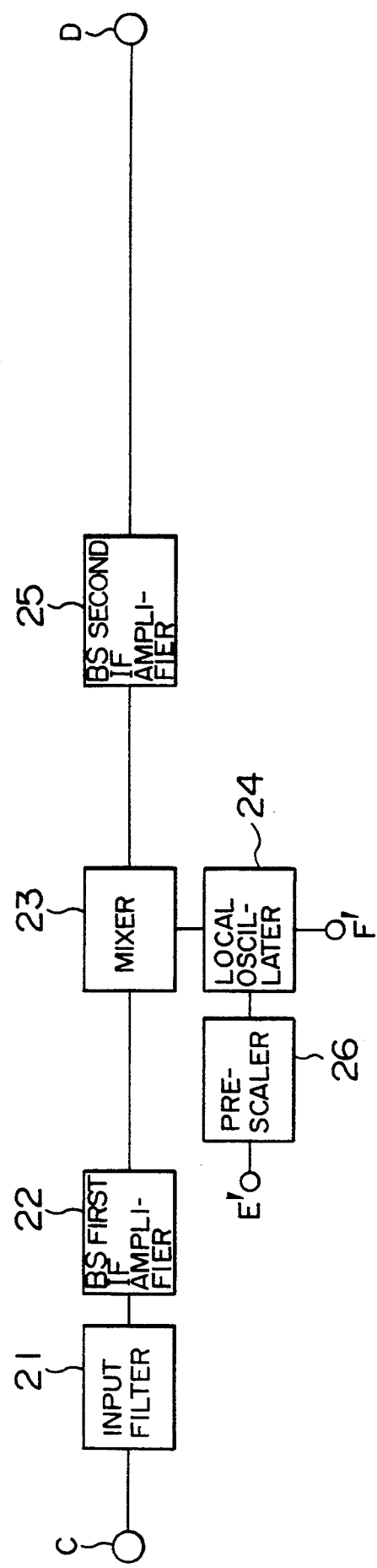
FIG. 2 is a block diagram showing a BS second mixer portion of a BS tuner.
Figure 3:
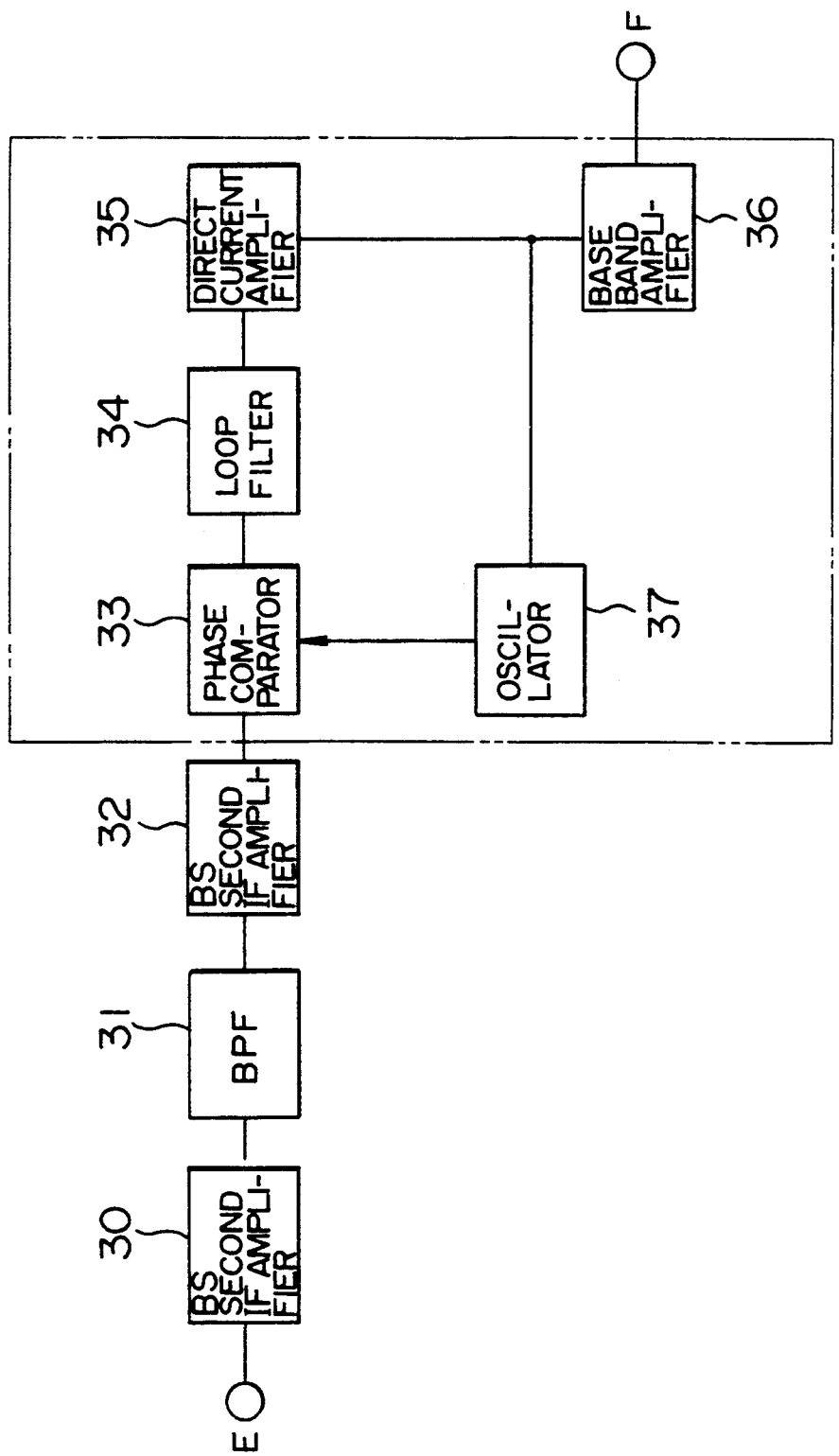
FIG. 3 is a block diagram showing a FM demodulator of the BS tuner.
Figure 4A:
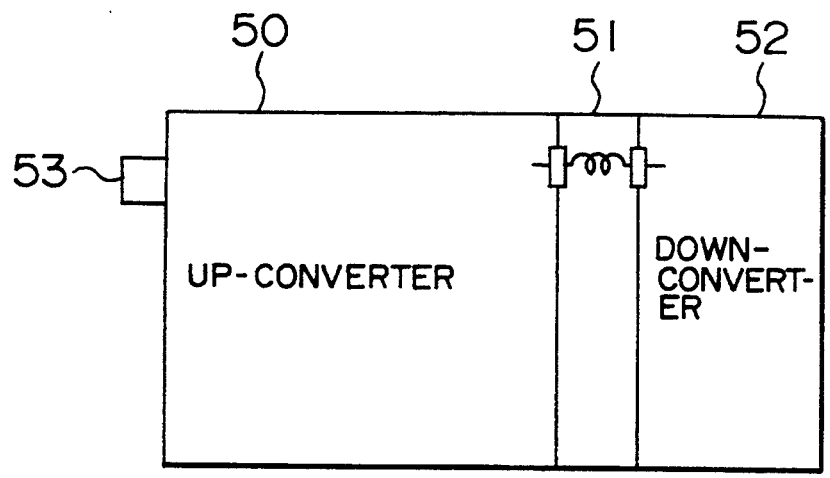
FIGS. 4A and 4B are block diagrams, each showing an arrangement of a conventional tuner.
Figure 4B:
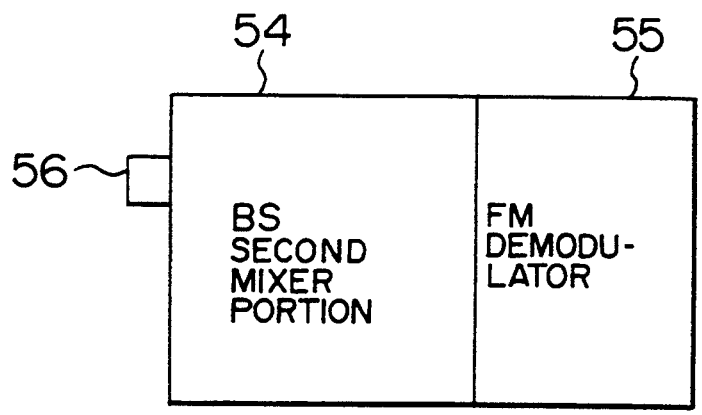
Figure 5:
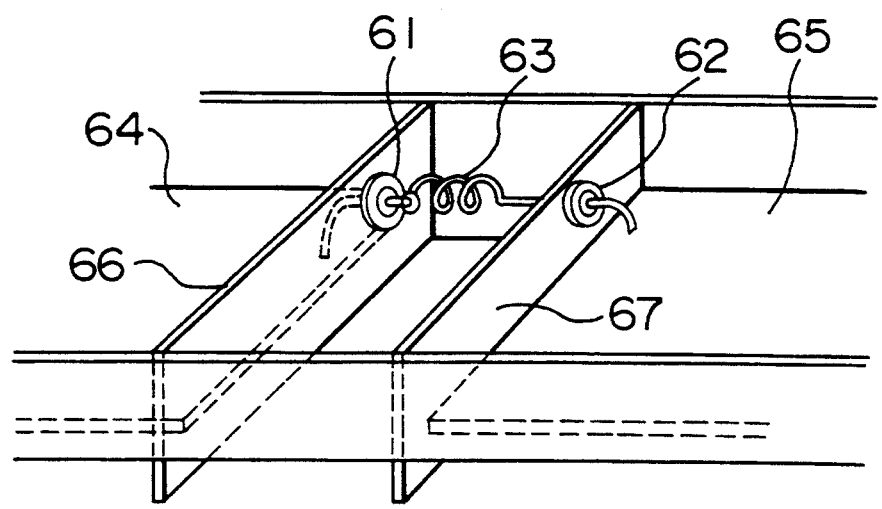
FIG. 5 is a perspective view showing a conventional up- and down-converter coupling portion.
Figure 6:
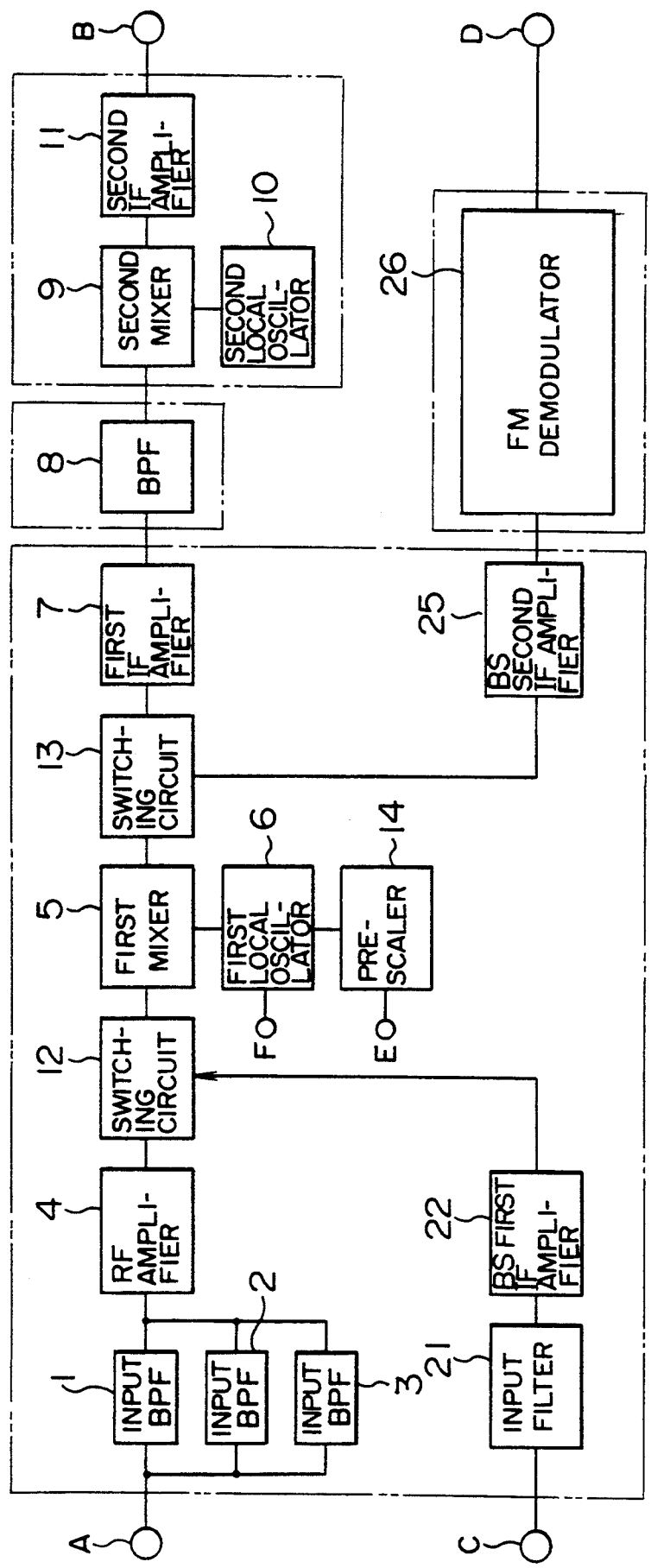
FIG. 6 is a block diagram showing an embodiment of a television tuner of the present invention.

An embodiment of the present invention will be described with reference to the drawings. FIG. 6 is a block diagram showing an embodiment of a system of the present invention for receiving VHF, UHF and satellite broadcasting. Reference numerals 1 through 11, 14, 21, 22 and 25 in FIG. 6 denote like blocks shown in FIGS. 1 and 2. Reference numeral 12 denotes an input switching circuit provided between a RF amplifier 4 and a first mixer 5, 13 denotes an output switching circuit provided between the first mixer 5 and a first IF amplifier 7 and reference numeral 26 denotes an FM demodulator shown in FIG. 3.

An operation of the thus formed receiving system will be described with reference to the block diagram of FIG. 6. The operation of the circuit from a terminal A to a terminal B in FIG. 6 is identical with that in FIG. 1. The first mixer 5, the first local oscillation circuit 6 and the prescaler 14 in the double superheterodyne also work for a BSIF signal which has been inputted from a terminal C as well as a signal from the terminal A. Television signals and BS signals are switched by switching circuits 12 and 13. The BS signal in a 400 MHz band which has passed through the switching circuit 13 is amplified in a BS second IF amplifier 25 and is demodulated in an FM demodulator 26 and is outputted from a terminal D.

The structure of the tuner of the present invention will be described with reference to FIGS. 7 and 8.

Figure 7:
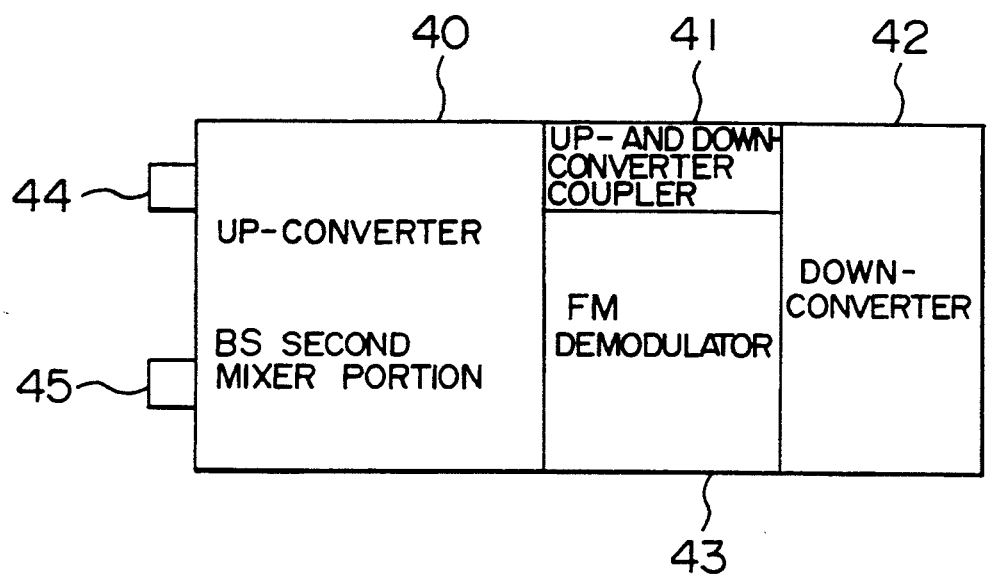
FIG. 7 is a block diagram showing an arrangement of the television tuner shown in FIG. 6.

In FIG. 7, reference numeral 40 denotes an up-converter and a BS second mixer portion for BS signal; 41 denotes a coupler 42 denotes a down-converter; 43 denotes FM demodulator; 44 denotes an input terminal for VHF and UHF signals; and 45 denotes a BSIF input terminal. The block 40 comprises components 1 through 7, 12 through 14, 21, 22, and 25 shown in FIG. 6; the block 41 comprises a BPF 8 shown in FIG. 6; the block 42 comprises the components 9 through 11 shown in FIG. 6 and the block 43 comprises the FM demodulator 26 shown in FIG. 6. The block 41 is disposed between the blocks 40 and 42 and the block 43 is disposed in a space surrounded by the blocks 40, 41, and 42.

Figure 8:
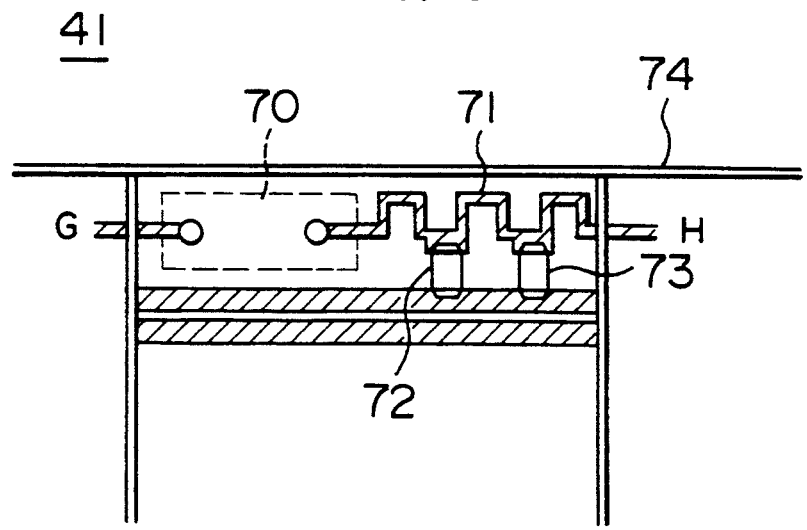
FIG. 8 is a plan view showing an up- and down-converter coupling portion in the television tuner shown in FIG. 6.

Referring now to FIG. 8, there is shown the structure of the up- and down-converter coupler 41 comprising a band pass filter 70, a patterned inductor 71 made of a foil of an electrically conductive material, capacitors 72 and 73 and a shield casing 74 functioning as a partition.

A first IF signal which has been inputted from a terminal G will pass through the band pass filter 70 and a low pass filter comprising the patterned inductor 71 and the capacitors 72 and 73 and is then outputted from a terminal H. The band pass filter 70 for passing through the first IF frequency signal and the low pass filter for preventing the leakage of the first local oscillation signal are adapted to couple the up-converter with the down-converter. This block is surrounded by the partition 74 and prevents unwanted signals from passing through a circuit between the input terminal G and the output terminal H.

A tuner which receives VHF, UHF and satellite broadcasting is made integrally and the up- and down-converters 40 and 42 are disposed so that they are sufficiently separated in position and the up- and down-converter coupler 41 and the FM demodulator 43 may be disposed between the up- and down-converters. Accordingly, spurious radiation due to mutual coupling of local oscillators is prevented. Miniaturization of the tuner may be further accomplished since the FM demodulator may be disposed in a remaining space which results from separating up- and down-converters from each other. The up- and down-converter coupler 41 may comprise a combination of a band pass filter and a strip line or a combination of a low pass filter and a strip line. Since both combinations make it possible to provide an elongated link portion which is surrounded by a shielding member, separation between the input and the output is improved and a filtering effect is enhanced.

As mentioned above in accordance with a present invention, a tuner for receiving a television signal is formed as a double superheterodyne system and is made integrally with a tuner for receiving satellite broadcasting. Up- and down-converters of the double superheterodyne are separated from each other and an up- and down-converter coupler and a FM demodulator are disposed therebetween. Two circuit boards need not be separated unlike the prior art. A mutual interference between local oscillators may be prevented, and a more compact and integral type tuner may be realized. The practical advantages are remarkable.

We claim:

1. A television tuner, comprising:
   a housing having a plurality of blocks each of which is surrounded by shielding partitions;
   a first tuner unit disposed in a first one of said blocks, for selectively and alternately receiving (a) television signals of UHF/VHF band or a CATV signal as a first input signal or (b) a satellite broadcast television IF signal as a second input signal, said first tuner unit converting the first input signal into a first intermediate frequency signal having a frequency higher than a frequency of the first input signal and converting the second input signal into a second intermediate frequency signal having a frequency lower than a frequency of the second input signal;
   a second tuner unit disposed in a second one of said blocks which is not adjacent to said first one of said blocks in which said first tuner unit is disposed, for converting the first intermediate frequency signal into a third intermediate frequency signal having a frequency lower than a frequency of the first intermediate frequency signal;
   an FM demodulator unit disposed in a third one of said blocks which is located between said first one and said second one of said blocks in which said first and second tuner units are disposed, for demodulating the second intermediate frequency signal; and
   a coupling means for coupling said first and second tuner units together, said coupling means including a patterned foil of an electrically conductive material adhered on a circuit board which extends through ones of said shielding partitions disposed between said first and second tuner units.

2. A television tuner as defined in claim 1, wherein said patterned foil comprises a patterned foil inductor of an electrically conductive material adhered on said circuit board, said patterned foil inductor being disposed in a fourth one of said blocks which is located between said first one and said second one of said blocks in which said first and second tuner units are disposed.

3. A television tuner as defined in claim 2, wherein said coupling means further includes two tip capacitors, each being connected between an end of said patterned foil inductor and a ground level.

4. A television tuner as defined in claim 1, wherein said coupling means further includes a band pass filter for the first intermediate frequency signal, said band pass filter being disposed in a fourth one of said blocks which is located between said first one and said second one of said blocks in which said first and second tuner units are disposed.

5. A television tuner as defined in claim 2, wherein said coupling means further includes a band pass filter for the first intermediate frequency signal, said band pass filter being disposed in the said fourth one of said blocks.

6. A television tuner as defined in claim 3, wherein said coupling means further includes a band pass filter for the first intermediate frequency signal, said band pass filter being disposed in said fourth one of said blocks.

7. A television tuner as defined in claim 5, wherein said coupling means further includes a low pass filter disposed in said fourth one of said blocks and connected to said band pass filter.

8. A television tuner as defined in claim 4, wherein said coupling means further includes a low pass filter disposed in said fourth one of said blocks and connected to said band pass filter.

9. A television tuner as defined in claim 1, wherein said coupling means further includes a low pass filter disposed in a fourth one of said blocks which is located between said first one of said blocks and said second one of said blocks.

* * * * *